United States Patent
Ogiwara et al.

(10) Patent No.: US 10,923,189 B2
(45) Date of Patent: Feb. 16, 2021

(54) MEMORY DEVICE

(71) Applicant: TOSHIBA MEMORY CORPORATION, Minato-ku (JP)

(72) Inventors: Ryu Ogiwara, Yokohama (JP); Daisaburo Takashima, Yokohama (JP); Takahiko Iizuka, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/353,172

(22) Filed: Mar. 14, 2019

(65) Prior Publication Data

US 2020/0098426 A1    Mar. 26, 2020

(30) Foreign Application Priority Data

Sep. 20, 2018    (JP) .................................. 2018-175546

(51) Int. Cl.
    *G11C 13/00*       (2006.01)
    *H01L 27/24*       (2006.01)
    *H03F 3/45*        (2006.01)

(52) U.S. Cl.
    CPC ...... *G11C 13/0069* (2013.01); *G11C 13/0026* (2013.01); *G11C 13/0038* (2013.01);
    (Continued)

(58) Field of Classification Search
    CPC .............................................. G11C 13/0069
    (Continued)

(56) References Cited

U.S. PATENT DOCUMENTS 9,208,872 B2    12/2015   Shiimoto
9,496,035 B2    11/2016   Di Vincenzo et al.
(Continued)

FOREIGN PATENT DOCUMENTS

| JP | 2014-175021 | 9/2014 |
| JP | 2017-4587 | 1/2017 |
| JP | 2019-164874 A | 9/2019 |

OTHER PUBLICATIONS

Cho, W., et al. "A 0.18pnn 3.0V 64Mb Non-Volatile Phase-Transition Random-Access Memory (PRAM)", 2004 IEEE International Solid-State Circuits Conference (ISSCC 2004) / Session 2 / Non-Volatile Memory / 2.1,2004, 9 pages.*

(Continued)

*Primary Examiner* — Muna A Techane
(74) *Attorney, Agent, or Firm* — Oblon, McClelland, Maier & Neustadt, L.L.P.

(57) ABSTRACT

According to one embodiment, a memory device includes a memory cell including a resistance change memory element and a selector element, a word line, a bit line connected to one end of the memory cell, an operational amplifier including a non-inverting input connected to the bit line, an output circuit including a first terminal connected to an output of the operational amplifier, a second terminal connected to the bit line, and a charge/discharge circuit including a capacitor, a charge circuit and a discharge circuit, each including one end connected to an inverting input of the operational amplifier. At the time of falling of a write voltage for the memory cell, a potential of the other end of the memory cell is set higher than a potential of the other end of the discharge circuit.

11 Claims, 7 Drawing Sheets

(52) U.S. Cl.
CPC ...... *G11C 13/0061* (2013.01); *H01L 27/2409* (2013.01); *H01L 27/2436* (2013.01); *H03F 3/45188* (2013.01); *G11C 2013/0078* (2013.01); *G11C 2213/72* (2013.01); *G11C 2213/79* (2013.01); *H03F 2200/396* (2013.01); *H03F 2203/45544* (2013.01); *H03F 2203/45616* (2013.01); *H03F 2203/45728* (2013.01)

(58) Field of Classification Search
USPC .......................................................... 365/148
See application file for complete search history.

(56) References Cited

U.S. PATENT DOCUMENTS

| | | | |
|---|---|---|---|
| 9,543,007 B2 | 1/2017 | Azuma et al. | |
| 10,210,928 B2* | 2/2019 | Tiburzi | G11C 13/0069 |
| 2005/0052923 A1* | 3/2005 | Uchikoba | G11C 11/40626 |
| | | | 365/222 |
| 2006/0133133 A1* | 6/2006 | Yamada | G11C 7/08 |
| | | | 365/149 |
| 2012/0039110 A1* | 2/2012 | Maejima | G11C 13/0004 |
| | | | 365/148 |
| 2012/0075912 A1* | 3/2012 | Hosono | G11C 13/0023 |
| | | | 365/148 |
| 2012/0230099 A1* | 9/2012 | Sheu | G11C 13/0069 |
| | | | 365/163 |
| 2013/0215669 A1* | 8/2013 | Haukness | G11C 13/0097 |
| | | | 365/148 |
| 2014/0254241 A1* | 9/2014 | Shiimoto | G11C 13/004 |
| | | | 365/148 |
| 2017/0004884 A1 | 1/2017 | Lam et al. | |
| 2017/0140817 A1* | 5/2017 | Buchanan | G11C 13/0069 |
| 2019/0295637 A1 | 9/2019 | Ogiwara et al. | |

OTHER PUBLICATIONS

Oh, H., et al. "Enhanced Write Performance of a 64-Mb Phase-Change Random Access Memory", IEEE Journal of Solid-State Circuits, vol. 41, No. 1,2006, 5 pages.*

Kang, S., et al. "A 0.1—pm 1,8-V 256-Mb Phase-Change Random Access Memory (PRAM) With 66-MHz Synchronous Burst-Read Operation", IEEE Journal of Solid-State Circuits, vol. 42, No. 1,2007, 9 pages.*

Stanisavljevic, M., et al. "Phase-Change Memory: Feasibility of Reliable Multilevel-cell Storage and Retention at Elevated Temperatures", 2015 IEEE International Reliability Physics Symposium, 2015, 6 page.*

Cho, W., et al. "A 0.18μm 3.0V 64Mb Non-Volatile Phase-Transition Random-Access Memory (PRAM)", 2004 IEEE International Solid-State Circuits Conference (ISSCC 2004) / Session 2 / Non-Volatile Memory / 2.1, 2004, 9 pages.

Cho, W., et al. A 0.18-μm 3.0-V 64-Mb Nonvolatile Phase-Transition Random Access Memory (PRAM), IEEE Journal of Solid-State Circuits, vol. 40, No. 1, 2005, 8 pages.

Kang, S., et al. "A 0.1—μm 1.8-V 256-Mb Phase-Change Random Access Memory (PRAM) With 66-MHz Synchronous Burst-Read Operation", IEEE Journal of Solid-State Circuits, vol. 42, No. 1, 2007, 9 pages.

Papandreou, N., et al. "Drift-Resilient Cell-State Metric for Multi-level Phase-Change Memory", 2011 International Electron Devices Meeting, 2011, 4 pages.

Sebastian, A., et al. "Non-resistance-based cell-state metric for phase-change memory", Journal of Applied Physics, vol. 110, No. 8, 2011, 7 pages.

Stanisavljevic, M., et al. "Phase-Change Memory: Feasibility of Reliable Multilevel-cell Storage and Retention at Elevated Temperatures", 2015 IEEE International Reliability Physics Symposium, 2015, 6 pages.

* cited by examiner

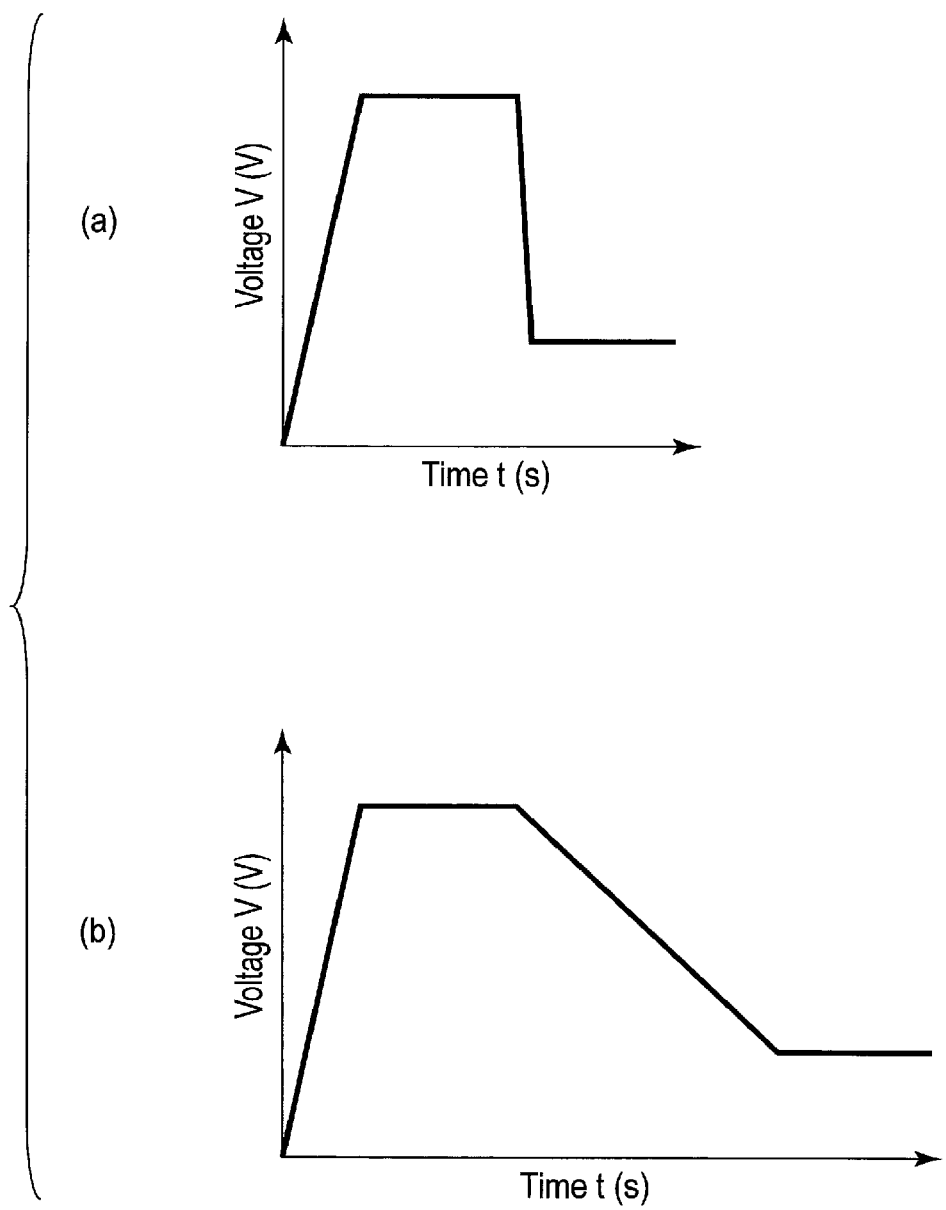
F I G. 2

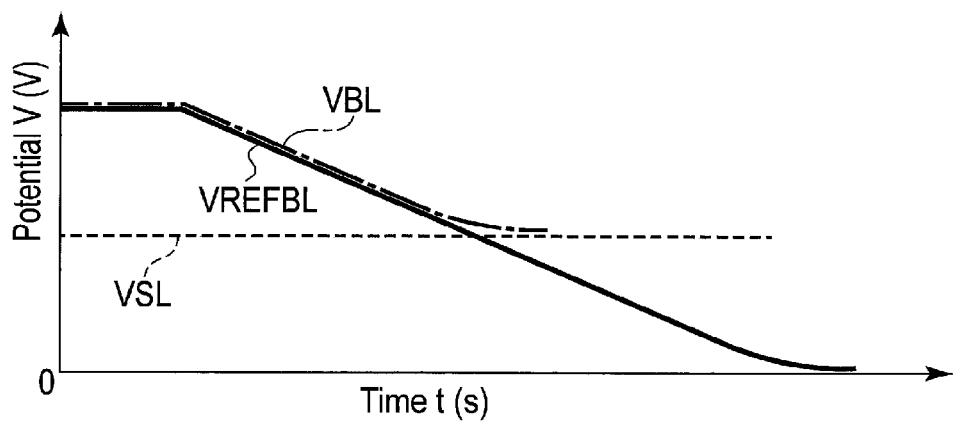
F I G. 3
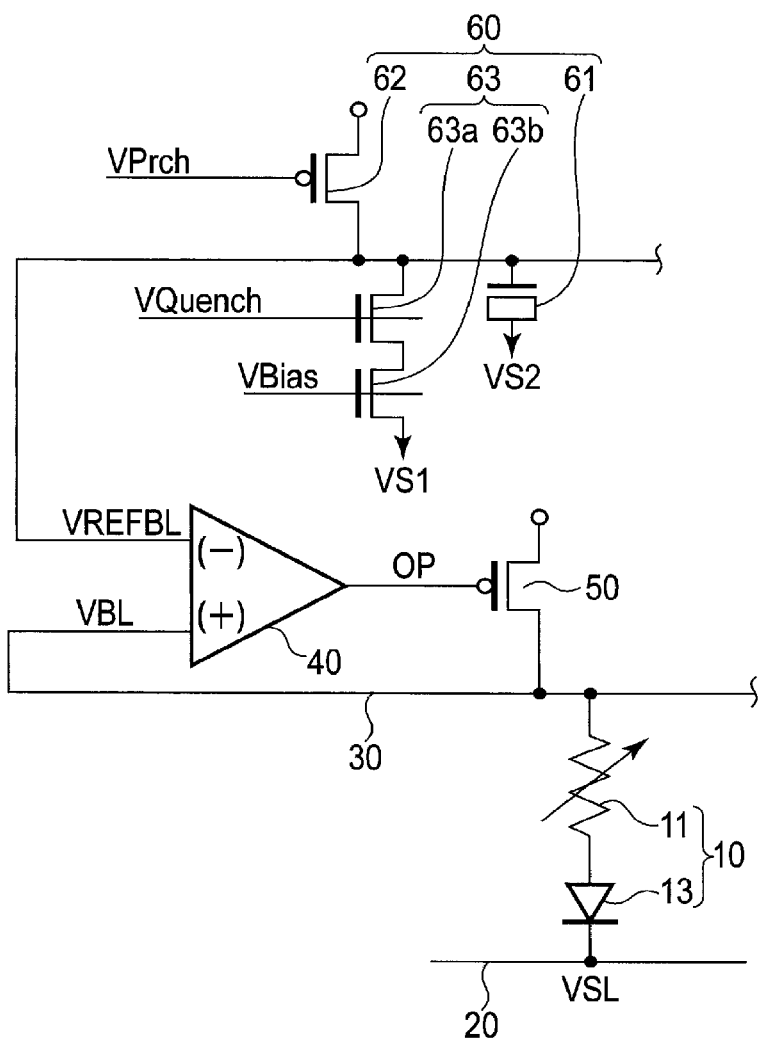
F I G. 4

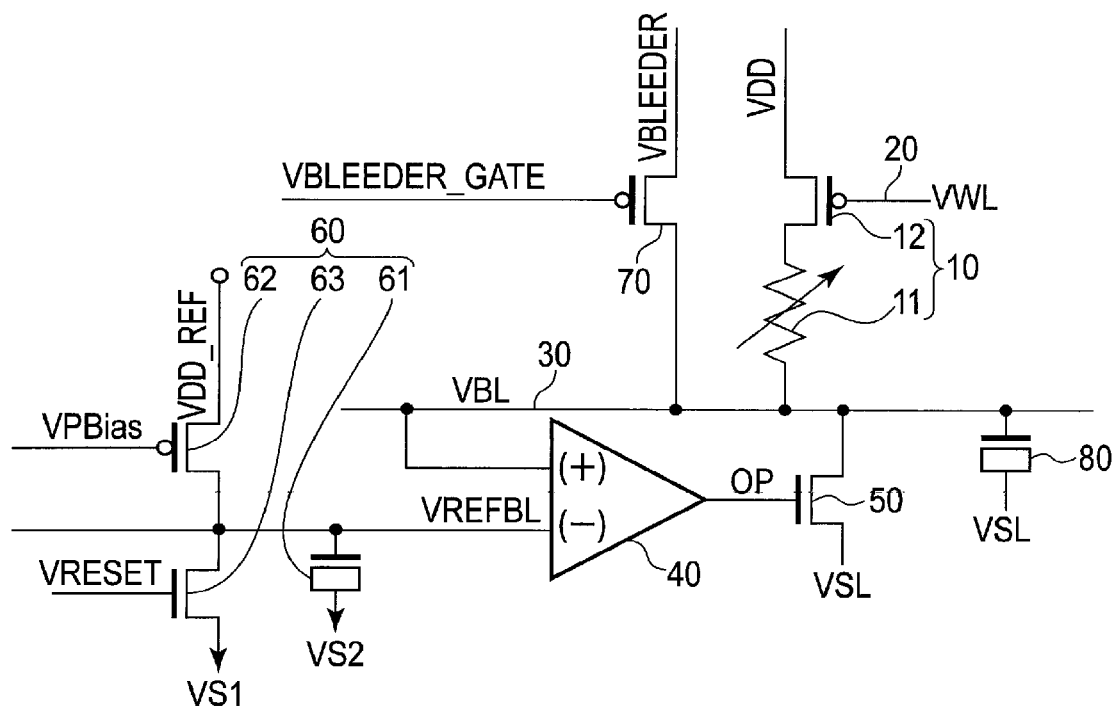
F I G. 5
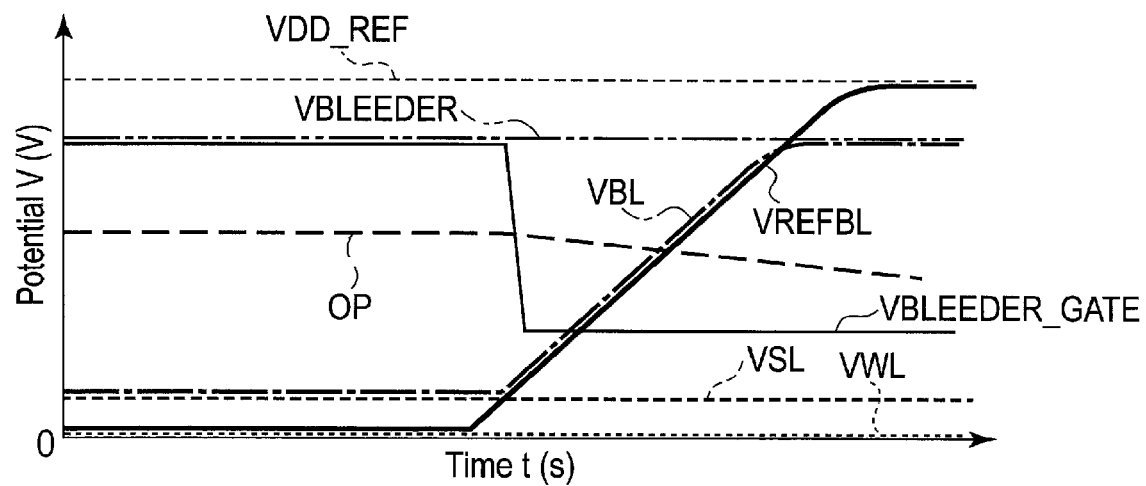
F I G. 6

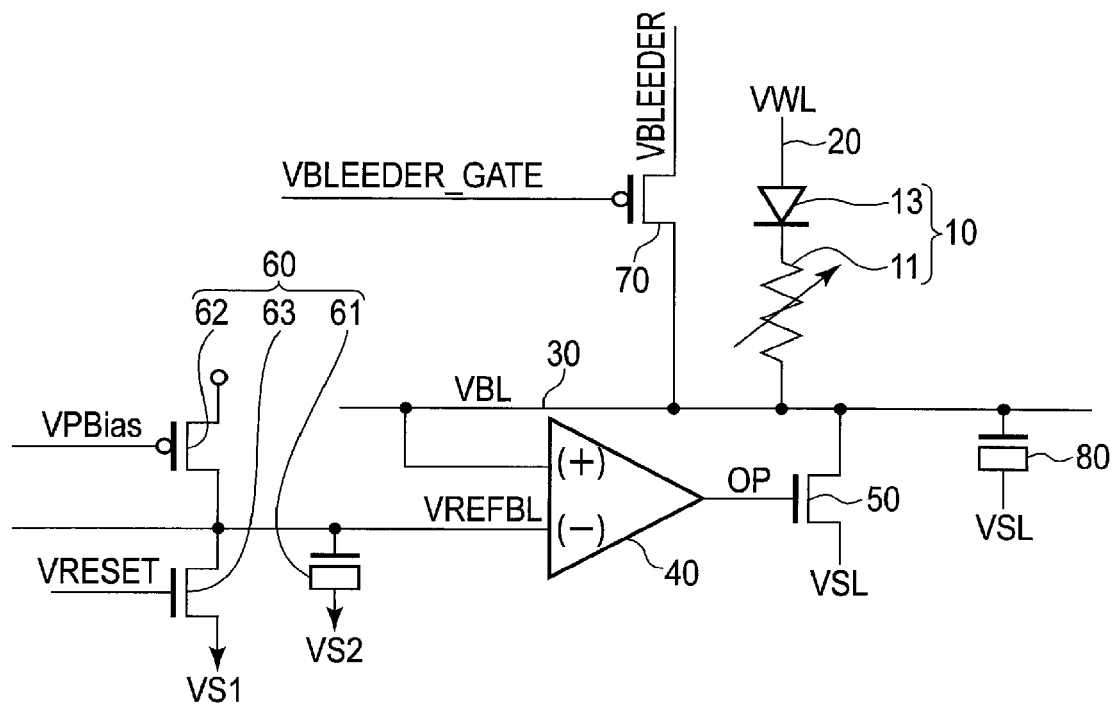
F I G. 7
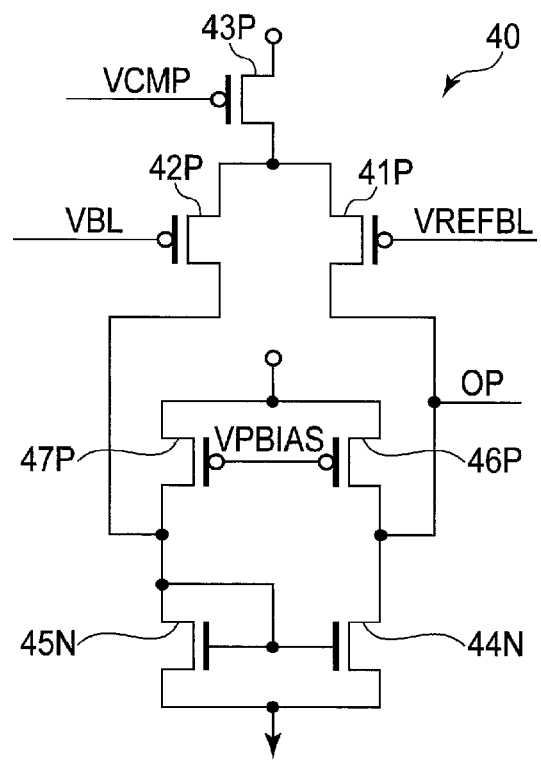
F I G. 8

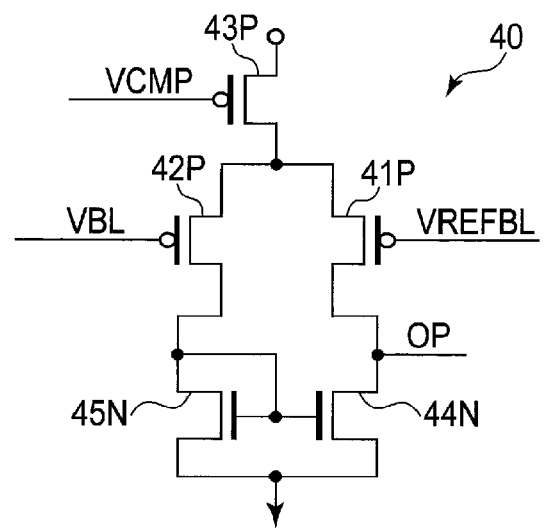
F I G. 9
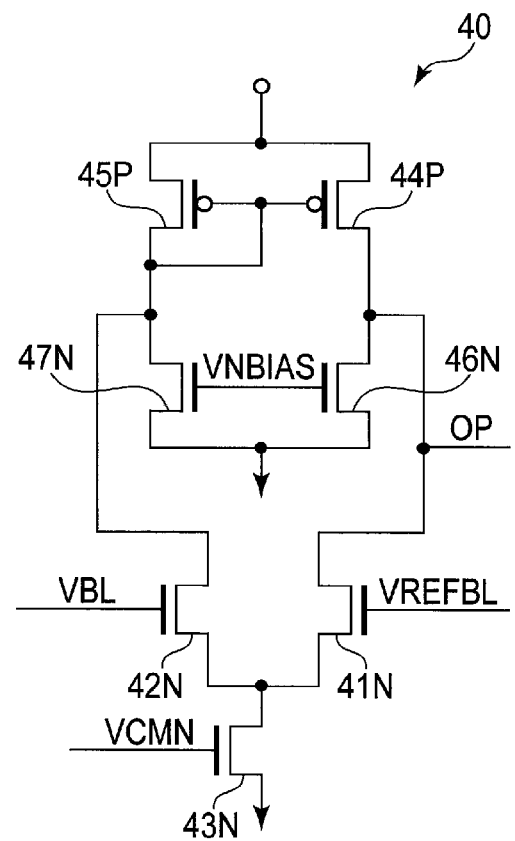
F I G. 10

US 10,923,189 B2

MEMORY DEVICE

CROSS-REFERENCE TO RELATED APPLICATIONS

This application is based upon and claims the benefit of priority from Japanese Patent Application No. 2018-175546, filed Sep. 20, 2018, the entire contents of which are incorporated herein by reference.

FIELD

Embodiments described herein relate generally to a memory device (semiconductor memory device).

BACKGROUND

A memory device (semiconductor integrated circuit device) in which transistors and resistance change memory element such as a phase change memory (PCM) element or the like are integrated on a semiconductor substrate is proposed. In a resistance change memory element, a low resistance state (set) or high resistance state (reset) can be set according to the falling speed (low falling speed and high falling speed) of the applied voltage.

However, in a memory device in which the aforementioned resistance change memory element is used, it could have hardly been said that appropriate fall/rise control has been carried out.

BRIEF DESCRIPTION OF THE DRAWINGS

FIG. 2 shows views each showing an applied voltage at the time when a resistance state of a resistance change memory element is to be set.

FIG. 3 is a view showing potential relationships among the sections of the memory device according to the first embodiment.

FIG. 4 is a circuit diagram showing a second configuration example of the memory device according to the first embodiment.

FIG. 5 is a circuit diagram showing a first configuration example of a memory device according to a second embodiment.

FIG. 6 is a view showing potential relationships among the sections of the memory device according to the second embodiment.

FIG. 7 is a circuit diagram showing a second configuration example of the memory device according to the second embodiment.

FIG. 8 is a circuit diagram showing a first configuration example of an operational amplifier according to a third embodiment.

FIG. 9 is a circuit diagram showing a second configuration example of the operational amplifier according to the third embodiment.

FIG. 10 is a circuit diagram showing a third configuration example of the operational amplifier according to the third embodiment.

DETAILED DESCRIPTION

In general, according to one embodiment, a memory device includes: a memory cell including a resistance change memory element in which a low resistance state or a high resistance state can be set according to a falling speed of a voltage to be applied across both terminals thereof, and a selector element connected in series to the resistance change memory element; a word line to which a signal for selecting the memory cell is supplied; a bit line connected to one end of the memory cell; an operational amplifier including a non-inverting input terminal connected to the bit line, an inverting input terminal, and an output terminal; an output circuit including a first terminal connected to the output terminal of the operational amplifier, a second terminal connected to the bit line, and a third terminal to which a predetermined potential is applied; and a charge/discharge circuit which includes a capacitor, a charge circuit section charging the capacitor, and a discharge circuit section discharging the capacitor, and in which one end of the charge circuit section, one end of the discharge circuit section, and one end of the capacitor are connected to the inverting input terminal of the operational amplifier, wherein at least at the time of falling of a write voltage for the memory cell, a potential of the other end of the memory cell is set higher than a potential of the other end of the discharge circuit section and a potential of the other end of the capacitor.

Hereinafter, embodiments will be described with reference to the accompanying drawings.

Embodiment 1

Figure 1:
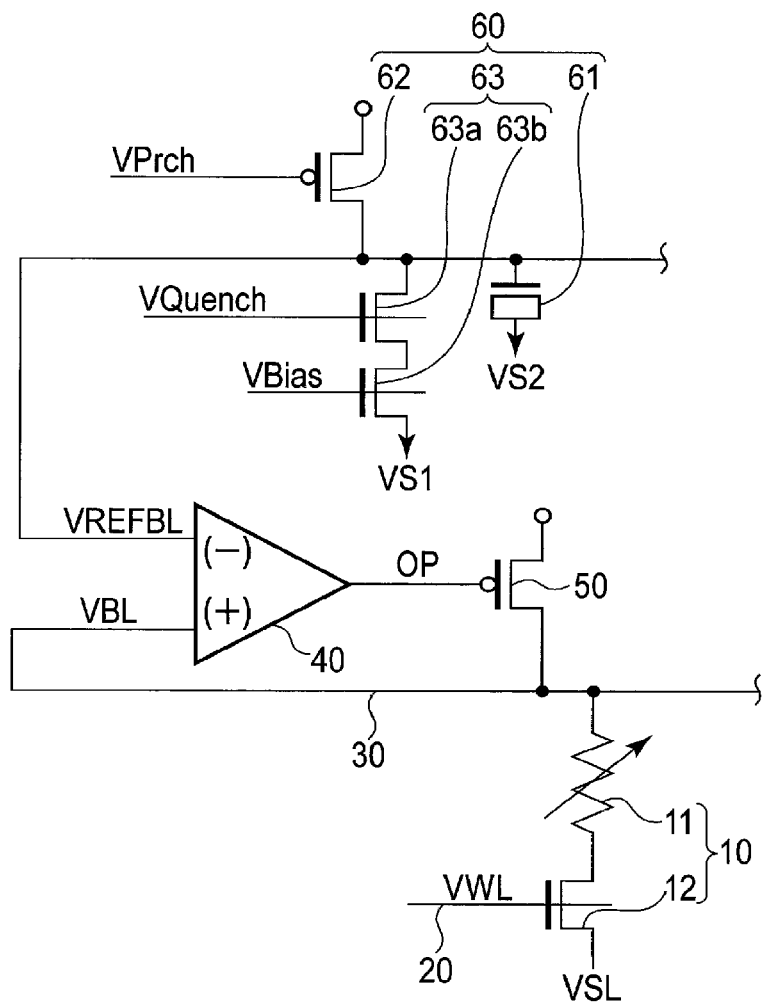
FIG. 1 is a circuit diagram showing a first configuration example of a memory device according to a first embodiment.

FIG. 1 is a circuit diagram showing a first configuration example of a memory device (semiconductor integrated circuit device) according to this embodiment.

The memory device shown in FIG. 1 includes a memory cell 10, word line 20, bit line 30, operational amplifier 40, output circuit 50, and charge/discharge circuit 60.

The memory cell 10 includes a resistance change memory element 11, and selector element 12 connected in series to the resistance change memory element 11.

In the resistance change memory element 11, a low resistance state (set) or high resistance state (reset) is set according to the falling speed of the applied voltage. FIG. 2 shows views each showing an applied voltage at the time when a resistance state of the resistance change memory element 11 is to be set. FIG. 2(a) shows an applied voltage waveform of a case where a high resistance state (reset) is to be set, and FIG. 2(b) shows an applied voltage waveform of a case where a low resistance state (set) is to be set. As shown in FIG. 2, the falling speed of the applied voltage of the case where the low resistance state (set) is to be set is less than the falling speed of the applied voltage of the case where the high resistance state (reset) is to be set. As the resistance change memory element 11, a phase change memory (PCM) element, interfacial phase change memory (iPCM) element, resistive RAM (ReRAM) element, conduction bridge RAM (CBRAM) element or the like can be used.

The selector element 12 is configured to select the resistance change memory element 11. That is, it is possible to carry out write and read to and from the resistance change memory element 11 selected by the selector element 12. In this configuration example, as the selector element 12, a MOS transistor (NMOS transistor) which is a three-terminal switch element is used.

To the memory cell 10, the word line 20 and bit line 30 are connected. More specifically, the memory cell 10 is provided at an intersection of the word line 20 and bit line 30. To the word line 20, a signal VWL used to select the memory cell 10 is supplied. That is, a selection signal is applied from the selected word line 20 to a gate (control terminal) of the MOS transistor (selector element 12), whereby the MOS transistor enters the on-state. The resistance change memory element 11 is connected in series to the MOS transistor (selector element 12), and hence by giving a predetermined potential difference between the potential VSL of the source of the MOS transistor and potential VBL of the bit line 30, it is possible to carry out write or read to or from the resistance change memory element 11.

The operational amplifier 40 includes a non-inverting input terminal, inverting input terminal, and output terminal. To the non-inverting input terminal, the bit line 30 is connected, and the bit line potential VBL is input. To the inverting input terminal, the charge/discharge circuit 60 to be described later is connected, and reference potential VREFBL is input.

To the output of the operational amplifier 40, a MOS transistor (PMOS Transistor) 50 is connected as the output circuit, to a gate (first terminal) thereof, the output terminal of the operational amplifier 40 is connected, to a drain (second terminal) thereof, the bit line 30 is connected, and to a source (third terminal) thereof, a predetermined potential is applied.

To the inverting input terminal of the operational amplifier 40, the charge/discharge circuit 60 is connected. The charge/discharge circuit 60 includes a capacitor 61, charge circuit section 62 configured to charge the capacitor 61, and discharge circuit section 63 configured to discharge the electric charge of the capacitor 61, and one end of the capacitor 61, one end of the charge circuit section 62, and one end of the discharge circuit section 63 are connected to the inverting input terminal of the operational amplifier 40.

The charge circuit section 62 is constituted of a PMOS transistor and, to a gate of this PMOS transistor, a pre-charge signal VPrch is supplied. By making the PMOS transistor 62 enter the on-state by means of the pre-charge signal VPrch, it is possible to charge the capacitor 61.

The discharge circuit section 63 is constituted of an NMOS transistor 63a and NMOS transistor 63b. To a gate of the NMOS transistor 63a, a quench signal VQuench is supplied, and to a gate of the NMOS transistor 63b, a bias signal VBias is supplied. By making the NMOS transistor 63a and NMOS transistor 63b enter the on-state by means of the quench signal VQuench and bias signal VBias, it is possible to discharge the electric charge of the capacitor 61.

In this embodiment, the potential VSL on the lower-potential side of the memory cell 10 is set higher than the potential (potential of the source of the NMOS transistor 63b) VS1 on the lower-potential side of the discharge circuit section 63 and potential VS2 on the lower-potential side of the capacitor 61. The potential VS1 and potential VS2 may have an identical potential. By setting the potentials in this way, it becomes possible, when write to the resistance change memory element 11 is carried out, to appropriately control the fall of the voltage to be applied to the resistance change memory element 11. Hereinafter, descriptions will be given of the above.

FIG. 3 is view showing potential relationships among the sections of the memory device. In the example of FIG. 3, the potential VS1 on the lower-potential side of the discharge circuit section 63 and potential VS2 on the lower-potential side of the capacitor 61 are made 0[V]. As described above, in this embodiment, the potential VSL on the lower-potential side of the memory cell 10 is set higher than the potential VS1 and potential VS2. Accordingly, it is possible to make the last part (tail part) of the falling part of the bit line potential VBL steep. Assuming that the potential VSL is equal to the potential VS1 and potential VS2, the reference potential VREFBL applied to the inverting input terminal of the operational amplifier 40 is saturated in the vicinity of the potential VSL, and hence the tail part of the falling part of the bit line potential VBL becomes gentle. In this embodiment, the reference potential VREFBL can be made lower than the potential VSL, and hence it is possible to make the tail part of the falling part of the bit line potential VBL steep.

As described above, in this embodiment, it is possible to make the tail part of the bit line potential VBL steep, and hence when write to the resistance change memory element 11 is carried out, it becomes possible to appropriately control the fall of the voltage to be applied to the resistance change memory element 11.

FIG. 4 is a circuit diagram showing a second configuration example of the memory device according to this embodiment. It should be noted that the fundamental items are identical to the first configuration example, and hence descriptions of the items described in the first configuration example are omitted.

In the first configuration example described above, although the three-terminal switch element is used as the selector element 12 in the memory cell 10, in this configuration example, a two-terminal switch element is used as a selector element 13. When the two-terminal switch element is used as the selector element 13, the word line 20 is connected to the lower-potential side of the memory cell 10.

As the two-terminal switch element 13, a diode or two-terminal switch element containing therein a chemical element identical to the chemical element contained in the resistance change memory element such as a chalcogen element or the like can be used.

In the aforementioned two-terminal switch element, when the voltage to be applied across the two terminals thereof is less than the threshold voltage or built-in potential, the two-terminal switch element is in the high resistance state (for example, electrically non-conductive state). When the voltage to be applied across the two terminals thereof is greater than the threshold voltage or built-in potential, the two-terminal switch element is in the low resistance state (for example, electrically conductive state). The two-terminal switch element may have the aforementioned function in both directions. The aforementioned switch element may contain therein at least one chalcogen element selected from a group constituted of Te, Se, and S. Alternatively, the aforementioned switch element may contain therein a chalcogenide which is a compound containing therein one of these chalcogen elements. Further, the aforementioned switch element may contain therein at least one chemical element selected from a group constituted of B, Al, Ga, In, C, Si, Ge, Sn, As, P, and Sb. Further, when the aforementioned switch element contains therein a chemical element identical to the chemical element contained in the resistance change memory element, the manufacture thereof is facilitated, and hence such a case is desirable.

When the two-terminal switch element is used as the selector element 13, by applying a predetermined potential difference between the word line 20 connected to the selected memory cell 10 and bit line 30 connected to the selected memory cell 10, it is possible to carry out write and read to and from the selected memory cell 10.

In this configuration example too, as in the case of the aforementioned first configuration example, the potential VSL on the lower-potential side of the memory cell 10 is set higher than the potential VS1 on the lower-potential side of the discharge circuit section 63 and potential VS2 on the lower-potential side of the capacitor 61. That is, in this configuration example, the potential relationships among the sections shown in FIG. 3 are present. Accordingly, as in the case of the first configuration example, it is possible to make the last part (tail part) of the falling part of the bit line potential VBL steep, and when write to the resistance change memory element 11 is carried out, it becomes possible to appropriately control the fall of the voltage to be applied to the resistance change memory element 11.

Embodiment 2

Next, a second embodiment will be described below. It should be noted that the fundamental items are identical to the first embodiment, and hence descriptions of the items described in the first embodiment are omitted.

FIG. 5 is a circuit diagram showing a first configuration example of a memory device (semiconductor integrated circuit device) according to this embodiment.

The memory device shown in FIG. 5 includes a memory cell 10, word line 20, bit line 30, operational amplifier 40, output circuit 50, charge/discharge circuit 60, bleeder circuit 70, and capacitor 80.

As in the case of the first embodiment, the memory cell 10 includes a resistance change memory element 11, and selector element 12 connected in series to the resistance change memory element 11. The fundamental configuration and function of each of the resistance change memory element 11 and selector element 12 are identical to the resistance change memory element 11 and selector element 12 described in the first configuration example of the first embodiment. However, in this configuration example, as the selector element 12, a PMOS transistor is used.

To the memory cell 10, the word line 20 and bit line 30 are connected. The fundamental configuration and function of each of the word line 20 and bit line 30 are identical to the word line 20 and bit line 30 described in the first configuration example of the first embodiment.

The operational amplifier 40 includes a non-inverting input terminal, inverting input terminal, and output terminal. To the non-inverting input terminal, the bit line 30 is connected, and the potential VBL is input. To the inverting input terminal, the charge/discharge circuit 60 to be described later is connected, and a reference potential VREFBL is input.

To the output of the operational amplifier 40, a MOS transistor (NMOS Transistor) 50 is connected as the output circuit, to a gate (first terminal) thereof, the output terminal of the operational amplifier 40 is connected, to a drain (second terminal) thereof, the bit line 30 is connected, and to a source (third terminal) thereof, the voltage VSL is applied.

To the inverting input terminal of the operational amplifier 40, the charge/discharge circuit 60 is connected. The charge/discharge circuit 60 includes a capacitor 61, charge circuit section 62 configured to charge the capacitor 61, and discharge circuit section 63 configured to discharge the electric charge of the capacitor 61, and one end of the capacitor 61, one end of the charge circuit section 62, and one end of the discharge circuit section 63 are connected to the inverting input terminal of the operational amplifier 40.

The charge circuit section 62 is constituted of a PMOS transistor and, to a gate of this PMOS transistor, a bias voltage signal VPBias is supplied. By making the PMOS transistor 62 enter the on-state by means of the bias voltage signal VPBias, it is possible to charge the capacitor 61.

The discharge circuit section 63 is constituted of an NMOS transistor 63. To a gate of the NMOS transistor 63, a reset signal VRESET is supplied. By making the NMOS transistor 63 enter the on-state by means of the reset signal VRESET, it is possible to discharge the electric charge of the capacitor 61.

In this embodiment, the bleeder circuit 70 is connected to the bit line 30. The bleeder circuit 70 is constituted of a PMOS transistor. To a gate of the PMOS transistor, a bleeder gate signal VBLEEDER_GATE is supplied and, to a source of the PMOS transistor, a bleeder potential VBLEEDER is supplied. When the bleeder gate signal VBLEEDER_GATE is made to have such a potential that the PMOS transistor 70 is slightly turned on, a certain fixed current flows through the bleeder circuit 70.

In this embodiment, the potential VSL on the lower-potential side of the output circuit 50 is set higher than the potential (potential of the source of the NMOS transistor 63) VS1 on the lower-potential side of the discharge circuit section 63 and potential VS2 on the lower-potential side of the capacitor 61. The potential VS1 and potential VS2 may have an identical potential. By setting the potentials in this way, it becomes possible, when write to the resistance change memory element 11 is carried out, to appropriately control the fall (i.e., rise of the write voltage applied to the bit line 30 connected to the memory cell 10) of the voltage to be applied across both ends of the resistance change memory element 11. Hereinafter, descriptions will be given of the above.

FIG. 6 is a view showing potential relationships among the sections of the memory device. In the example of FIG. 6, the potential VS1 on the lower-potential side of the discharge circuit section 63 and potential VS2 on the lower-potential side of the capacitor 61 are made 0[V]. As described above, in this embodiment, the potential VSL on the lower-potential side of the output circuit 50 is set higher than the potential VS1 and potential VS2. Accordingly, it is possible to make the first part of the rising part of the bit line potential VBL steep. Assuming that the potential VSL is equal to the potential VS1 and potential VS2, when the reference potential VREFBL to be applied to the inverting input terminal of the operational amplifier 40 starts to rise, the reference potential VREFBL is equal to the potential VSL, and hence the first part of the rising part of the bit line potential VBL becomes gentle. In this embodiment, it is possible to make the reference potential VREFBL lower than the potential VSL, and hence it is possible to make the first part of the rising part of the bit line potential VBL steep.

As described above, in this embodiment, it is possible to make the first part of the rising part of the bit line potential VBL steep, and hence when write to the resistance change memory element 11 is carried out, it becomes possible to appropriately control the fall (rise of the write voltage applied to the bit line 30 connected to the memory cell 10) of the voltage to be applied across both ends of the resistance change memory element 11.

Further, in this embodiment, the potential VDD REF of the source (terminal of the charge circuit section 62 on the higher-potential side) of the PMOS transistor 62 is higher than the potential VDD of the source (terminal of the selector element 12 on the higher-potential side) of the PMOS transistor 12. That is, the following condition is established.

VDD_REF>VDD

Further, the potential VDD_REF of the source (terminal of the charge circuit section 62 on the higher-potential side) of the PMOS transistor 62 is higher than the potential VBLEEDER of the source (terminal of the bleeder circuit 70 on the higher-potential side) of the PMOS transistor 70. That is, the following condition is established.

VDD_REF>VBLEEDER

By setting potential relationships as described above, it is possible, when write to the resistance change memory element 11 is carried out, to make the last part (tail part) of the rising part of the bit line potential VBL steep. Accordingly, it becomes possible to appropriately control the fall of the voltage to be applied across both terminals of the resistance change memory element 11.

Further, in this embodiment, as shown in FIG. 6, the timing at which the bleeder circuit (MOS transistor) 70 enters the on-state and timing at which charging of the capacitor 61 is started by the charge circuit section 62 correspond to (synchronize with) each other. That is, in this embodiment, the bleeder circuit 70 is kept in the off-state until charging of the capacitor 61 is started. By employing such a configuration, it is possible to reduce the electric power consumption.

FIG. 7 is a circuit diagram showing a second configuration example of the memory device according to this embodiment. It should be noted that the fundamental items are identical to the first configuration example, and hence descriptions of the items described in the first configuration example are omitted.

In the first configuration example described above, although the three-terminal switch element is used as the selector element 12 in the memory cell 10, in this configuration example, a two-terminal switch element is used as a selector element 13. When the two-terminal switch element is used as the selector element 13, the word line 20 is connected to the higher-potential side of the memory cell 10.

As the two-terminal switch element 13, as in the case of the two-terminal switch element 13 described in the first embodiment, a diode or two-terminal switch element containing therein a chemical element identical to the chemical element contained in the resistance change memory element such as a chalcogen element or the like can be used.

When the two-terminal switch element is used as the selector element 13, by applying a predetermined potential difference between the word line 20 connected to the selected memory cell 10 and bit line 30 connected to the selected memory cell 10, it is possible to carry out write and read to and from the selected memory cell 10.

In this configuration example too, as in the case of the aforementioned first configuration example, the potential VSL on the lower-potential side of the output circuit 50 is set higher than the potential VS1 on the lower-potential side of the discharge circuit section 63 and potential VS2 on the lower-potential side of the capacitor 61. Accordingly, as in the case of the first configuration example, it is possible to make the first part of the rising part of the bit line potential VBL steep, and when write to the resistance change memory element 11 is carried out, it becomes possible to appropriately control the fall (rise of the write voltage applied to the bit line 30 connected to the memory cell 10) of the voltage to be applied across both ends of the resistance change memory element 11.

Further, as in the case of the aforementioned first configuration example, the timing at which the bleeder circuit (MOS transistor) 70 enters the on-state and timing at which charging of the capacitor 61 is started by the charge circuit section 62 correspond to (synchronize with) each other, and hence it is possible to reduce the electric power consumption.

Embodiment 3

Next, a third embodiment will be described below. It should be noted that the fundamental items are identical to the first and second embodiments, and hence descriptions of the items described in the first and second embodiments are omitted.

This embodiment is an embodiment mainly relating to the operational amplifier 40 described in the first and second embodiments.

FIG. 8 is a circuit diagram showing a first configuration example of an operational amplifier 40 according to this embodiment.

The operational amplifier 40 of this configuration example includes a PMOS transistor (first transistor) 41P, PMOS transistor (second transistor) 42P, PMOS transistor (third transistor) 43P, NMOS transistor (fourth transistor) 44N, NMOS transistor (fifth transistor) 45N, PMOS transistor (sixth transistor) 46P, and PMOS transistor (seventh transistor) 47P.

A source of the PMOS transistor 41P, source of the PMOS transistor 42P, and drain of the PMOS transistor 43P are connected to each other. A gate of the PMOS transistor 41P corresponds to the inverting input terminal of the operational amplifier 40, gate of the PMOS transistor 42P corresponds to the non-inverting input terminal of the operational amplifier 40, and drain of the PMOS transistor 41P corresponds to the output terminal of the operational amplifier 40. That is, to the gate of the PMOS transistor 41P, the reference voltage VREFBL is input, to the gate of the PMOS transistor 42P, the bit line voltage VBL is input, and from the drain of the PMOS transistor 41P, the output signal OP of the operational amplifier 40 is output. To each of the gate of the PMOS transistor 46P and gate of the PMOS transistor 47P, the potential VPBIAS is supplied.

Heretofore, in order to make a fixed current flow into the operational amplifier 40, to the gate of the PMOS transistor 43P, a fixed potential configured to slightly turn on the PMOS transistor 43P is input, in this embodiment, however, to the gate of the PMOS transistor 43P, a signal according to the variation of the signal to be input to the gate of the PMOS transistor 41P is input. More specifically, when the voltage of the gate signal VREFBL of the PMOS transistor 41P decreases, the voltage of the gate signal VCMP of the PMOS transistor 43P also decreases and, when the voltage of the gate signal VREFBL of the PMOS transistor 41P increases, the voltage of the gate signal VCMP of the PMOS transistor 43P also increases. In this configuration example, the gate signal VREFBL of the PMOS transistor 41P and gate signal VCMP of the PMOS transistor 43P are made common to each other. That is, in this embodiment, the gate signal VREFBL is equal to the gate signal VCMP ("VREFBL=VCMP").

The drain of the NMOS transistor 44N is connected to the drain of the PMOS transistor 41P and drain of the PMOS transistor 46P. The drain of the NMOS transistor 45N is connected to the drain of the PMOS transistor 42P, gate of the NMOS transistor 44N, gate of the NMOS transistor 45N, and drain of the PMOS transistor 47P.

To the source of the PMOS transistor 43P, source of the PMOS transistor 46P, and source of the PMOS transistor 47P, the positive side (higher-potential side) of the power source is connected. To the source of the NMOS transistor 44N, and source of the NMOS transistor 45N, the negative side (lower-potential side) of the power source is connected.

When circuit simulation was carried out with respect to the circuit shown in FIG. 8, the following simulation result was obtained.

It turned out that when the reference voltage VREFBL and bit line voltage VBL are low, and output voltage OP is high, if the gate voltage VCMP of the PMOS transistor 43P is low, satisfactory circuit characteristics can be obtained. Further, it turned out that when the reference voltage VREFBL and bit line voltage VBL are high, and output voltage OP is low, if the gate voltage VCMP of the PMOS transistor 43P is high, satisfactory circuit characteristics can be obtained.

Further, it turned out that when the absolute value of the threshold voltage of the PMOS transistors 41P, 42P, 46P, and 47P is made higher than the absolute value of the threshold voltage of the other MOS transistors (for example, the MOS transistor in the charge circuit section 62 and MOS transistor in the discharge circuit section 63) within a range of 0.1 to 0.2V, satisfactory circuit characteristics can be obtained.

Further, it turned out that when the absolute value of the threshold voltage of the MOS transistor of the output circuit 50 is made lower than the absolute value of the threshold voltage of the other MOS transistors (for example, the MOS transistor in the charge circuit section 62 and MOS transistor in the discharge circuit section 63) within a range of 0.1 to 0.2V, satisfactory circuit characteristics can be obtained.

Accordingly, as described above, it is desirable that the circuit operation be controlled in such a manner that when the voltage of the gate signal VREFBL of the PMOS transistor 41P decreases, the voltage of the gate signal VCMP of the PMOS transistor 43P also decreases and, when the voltage of the gate signal VREFBL of the PMOS transistor 41P increases, the voltage of the gate signal VCMP of the PMOS transistor 43P also increases. It is particularly desirable that the relationship "VREFBL=VCMP" be maintained.

FIG. 9 is a circuit diagram showing a second configuration example of the operational amplifier 40 according to this embodiment. It should be noted that the fundamental items are identical to the first configuration example, and hence descriptions of the items described in the first configuration example are omitted.

In this configuration example, the PMOS transistor 46P and PMOS transistor 47P which are provided in the first configuration example of FIG. 8 are omitted. The other fundamental configurations are identical to the first configuration example, and fundamental operations are also identical to the first configuration example.

In this configuration example too, by carrying out control identical to the first configuration example, it is possible to obtain satisfactory circuit characteristics as in the case of the first configuration example.

FIG. 10 is a circuit diagram showing a third configuration example of the operational amplifier 40 according to this embodiment. It should be noted that the fundamental items are identical to the first configuration example, and hence descriptions of the items described in the first configuration example are omitted.

This configuration example is an example in which the conductivity type of each of the MOS transistors of the first configuration example is changed to the opposite conductivity type. That is, in this configuration example, the PMOS transistor 41P, PMOS transistor 42P, PMOS transistor 43P, NMOS transistor 44N, NMOS transistor 45N, PMOS transistor 46P, and PMOS transistor 47P of the first configuration example are respectively replaced with the NMOS transistor 41N, NMOS transistor 42N, NMOS transistor 43N, PMOS transistor 44P, PMOS transistor 45P, NMOS transistor 46N, and NMOS transistor 47N. Further, to the gate of the NMOS transistor 46N and gate of the NMOS transistor 47N, the potential VNBIAS is applied. The other fundamental configurations are identical to the first configuration example, and fundamental operations are also identical to the first configuration example.

In this configuration example too, by carrying out control identical to the first configuration example, it is possible to obtain satisfactory circuit characteristics as in the case of the first configuration example.

Figure 11:
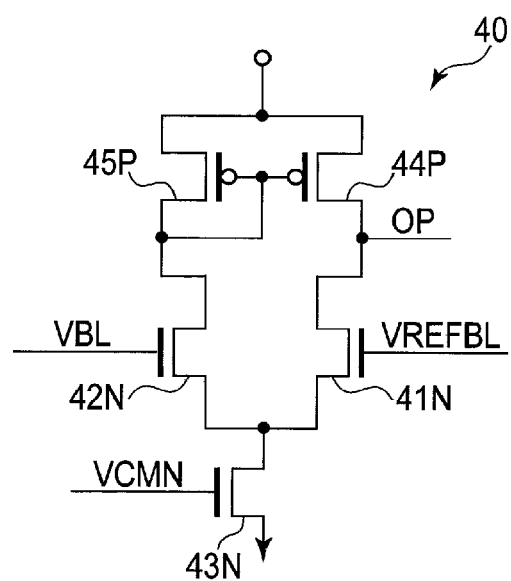
FIG. 11 is a circuit diagram showing a fourth configuration example of the operational amplifier according to the third embodiment.

FIG. 11 is a circuit diagram showing a fourth configuration example of the operational amplifier 40 according to this embodiment. It should be noted that the fundamental items are identical to the first, second, and third configuration examples, and hence descriptions of the items described in the first, second, and third configuration examples are omitted.

In this configuration example, the NMOS transistor 46N and NMOS transistor 47N which are provided in the third configuration example of FIG. 10 are omitted. The other fundamental configurations are identical to the third configuration example, and fundamental operations are also identical to the third configuration example.

In this configuration example too, by carrying out control identical to the first configuration example, it is possible to obtain satisfactory circuit characteristics as in the case of the first configuration example.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A memory device comprising:
a memory cell including a resistance change memory element in which a low resistance state or a high resistance state can be set according to a voltage decreasing speed of a write voltage signal to be applied across both terminals of the resistance change memory element, and a selector element connected in series to the resistance change memory element;
a word line to which a signal for selecting the memory cell is supplied;
a bit line connected to one end of the memory cell;
an operational amplifier including a non-inverting input terminal connected to the bit line, an inverting input terminal, and an output terminal;
an output circuit including a first terminal connected to the output terminal of the operational amplifier, a second terminal connected to the bit line, and a third terminal to which a predetermined potential is applied; and
a charge/discharge circuit which includes a capacitor, a charge circuit section charging the capacitor, and a discharge circuit section discharging the capacitor, and in which one end of the charge circuit section, one end of the discharge circuit section, and one end of the capacitor are connected to the inverting input terminal of the operational amplifier, wherein at least at the time of decreasing of the write voltage signal for the memory cell, a potential of the other end of the memory cell is set higher than a potential of the other end of the discharge circuit section and a potential of the other end of the capacitor.

2. The memory device of claim 1, wherein the selector element includes a three-terminal switch element, and the word line is connected to a control terminal of the three-terminal switch element.

3. The memory device of claim 1, wherein the selector element includes a two-terminal switch element, and the word line is connected to one of two terminals of the two-terminal switch element, the one of the two terminals being a terminal to which the resistance change memory element is not connected.

4. The memory device of claim 1, wherein the discharge circuit section includes a transistor, and a source of the transistor corresponds to the other end of the discharge circuit section.

5. The memory device of claim 1, wherein the output circuit includes a transistor, a gate of the transistor corresponds to the first terminal of the output circuit, a drain of the transistor corresponds to the second terminal of the output circuit, and a source of the transistor corresponds to the third terminal of the output circuit.

6. The memory device of claim 1, wherein an absolute value of a threshold voltage of a transistor in the output circuit is lower than an absolute value of a threshold voltage of a transistor in the charge circuit section or an absolute value of a threshold voltage of a transistor in the discharge circuit section within a range of 0.1 to 0.2V.

7. A memory device comprising:

a memory cell including a resistance change memory element in which a low resistance state or a high resistance state can be set according to a voltage decreasing speed of a write voltage signal to be applied across both terminals of the resistance change memory element, and a selector element connected in series to the resistance change memory element;

a word line to which a signal for selecting the memory cell is supplied;

a bit line connected to one end of the memory cell;

an operational amplifier including a non-inverting input terminal connected to the bit line, an inverting input terminal, and an output terminal;

an output circuit including a first terminal connected to the output terminal of the operational amplifier, a second terminal connected to the bit line, and a third terminal to which a predetermined potential is applied; and a charge/discharge circuit which includes a capacitor, a charge circuit section charging the capacitor, and a discharge circuit section discharging the capacitor, and in which one end of the charge circuit section, one end of the discharge circuit section, and one end of the capacitor are connected to the inverting input terminal of the operational amplifier, wherein the operational amplifier includes a first transistor of a first conductivity type, a second transistor of the first conductivity type, and a third transistor of the first conductivity type, a source of the first transistor, a source of the second transistor, and a drain of the third transistor are connected to each other, a gate of the first transistor corresponds to the inverting input terminal of the operational amplifier, a gate of the second transistor corresponds to the non-inverting input terminal of the operational amplifier, and a drain of the first transistor corresponds to the output terminal of the operational amplifier, and to a gate of the third transistor, a signal according to a variation of a signal to be input to the gate of the first transistor is input.

8. The memory device of claim 7, wherein the operational amplifier further includes a fourth transistor of a second conductivity type and a fifth transistor of the second conductivity type, a drain of the fourth transistor is connected to the drain of the first transistor, and a drain of the fifth transistor is connected to a drain of the second transistor, a gate of the fourth transistor, and a gate of the fifth transistor.

9. The memory device of claim 7, wherein to the gate of the third transistor, a signal common to a signal to be input to the gate of the first transistor is input.

10. The memory device of claim 8, wherein the operational amplifier further includes a sixth transistor of the first conductivity type and a seventh transistor of the first conductivity type, the drain of the fourth transistor is connected to a drain of the sixth transistor, the drain of the fifth transistor is connected to a drain of the seventh transistor, and to a gate of the sixth transistor and a gate of the seventh transistor, a certain potential is applied.

11. The memory device of claim 10, wherein an absolute value of a threshold voltage of each of the first, second, sixth, and seventh transistors is higher than an absolute value of a threshold voltage of a transistor in the charge circuit section and an absolute value of a threshold voltage of a transistor in the discharge circuit section within a range of 0.1 to 0.2V.

* * * * *